United States Patent

Fuke et al.

[11] Patent Number: 5,882,166
[45] Date of Patent: *Mar. 16, 1999

[54] MAGAZINE CONVEYING DEVICE

[75] Inventors: Shigeru Fuke, Musashino; Hideki Okajima, Mitaka; Kouhei Suzuki, Tachikawa; Junichi Ide, Fuchu, all of Japan

[73] Assignee: Kabushiki Kaisha Shinkawa, Tokyo, Japan

[*] Notice: The term of this patent shall not extend beyond the expiration date of Pat. No. 5,733,090.

[21] Appl. No.: 936,642

[22] Filed: Sep. 24, 1997

Related U.S. Application Data

[62] Division of Ser. No. 679,172, Jul. 12, 1996, Pat. No. 5,733,090.

[30] Foreign Application Priority Data

Jul. 13, 1995 [JP] Japan ..................... 7-199312

[51] Int. Cl.⁶ .................................. B65G 15/00
[52] U.S. Cl. .................. 414/331; 198/836.3; 414/403
[58] Field of Search ................. 414/331, 403, 414/416; 198/465.1, 465.3, 468.1, 468.6, 468.8, 817, 836.2

[56] References Cited

U.S. PATENT DOCUMENTS

| 5,394,979 | 3/1995 | Hall et al. ............... 198/836.3 |
| 5,733,090 | 3/1998 | Fuke et al. ............... 414/403 |

FOREIGN PATENT DOCUMENTS

| 5-166851 | 7/1993 | Japan . |
| 7-53009 | 2/1995 | Japan . |

*Primary Examiner*—Thomas J. Brahan
*Attorney, Agent, or Firm*—Koda & Androlia

[57] ABSTRACT

A lead frame magazine conveying device including magazine guides that guide the lead frame magazine to be conveyed. The magazine guide comprises a fixed guide and a movable guide which is a bar attached at the end of a swing lever. When the movable guide is brought into contact with one side of the lead frame magazine, the swing lever is tightened by a screw so as not to swing, thus turning the movable guide so as to be immovable, making it possible to smoothly guide the lead frame magazine in cooperation with the fixed guide which is in contact with another side of the lead frame magazine.

1 Claim, 5 Drawing Sheets

MAGAZINE CONVEYING DEVICE

This application is a division of application Ser. No. 08/679,172, filed Jul. 12, 1996, now U.S. Pat. No. 5,733,090.

BACKGROUND OF THE INVENTION

1. Field of the Invention

The present invention relates to a lead frame magazine conveying device which conveys lead frame magazines from a magazine loader section to a lead frame receiving position or lead frame feed-out position and then further conveys the lead frame magazines to a magazine unloader section.

2. Prior Art

Japanese Patent Application Kokai (Laid-Open) Nos. 5-166851 and 7-53009 disclose examples of conventional magazine conveying devices.

In these devices, a magazine loader section which supplies lead frame magazines and a magazine unloader section which receives lead frame magazines are designed to be a two stage (upper and lower) structure, and an elevator which receives lead frame magazines from the magazine loader section and is raised or lowered so that the lead frame magazines are positioned in a lead frame receiving position or lead frame feed-out position, and which is then raised or lowered so that the lead frame magazines which have received or fed out lead frames are positioned in the magazine unloader section.

In order to convey lead frame magazines to a prescribed position on the elevator, the magazine loader section has a fixed guide, which guides one side of the magazine, and a movable guide plate, which guides the other side of the magazine. The movable guide plate is adjustable so that it can meet the changes in the width of the lead frame magazine. More specifically, two grooves are formed in the direction of the fixed guide in the magazine loader section, which is in the shape of a stage, respective square-shank round-headed bolts are inserted into the grooves with the round heads of the bolts facing downward, the movable guide plate is fitted over the square-shank round-headed bolts, and the square-shank round-headed bolts are tightened from above by nuts. Accordingly, the spacing between the fixed guide and the movable guide plate is adjusted so as to coincide with the width of the lead frame magazine by loosening the two nuts and moving the movable guide plate so that the square-shank round-headed bolts move along the grooves. Following the adjustment of the movable guide plate, the movable guide plate is fastened to the magazine loader section by tightening the nuts.

In the prior art device described above, it is necessary to loosen two nuts in order to adjust the position of the movable guide plate. Accordingly, the adjustment operation requires some effort. Furthermore, since the movable guide plate moves along the grooves, it is necessary that the magazine loader section be a stage in order to form the grooves. Moreover, the movable guide plate guides the lower end portion of the magazine. As a result, such a system is not suitable for use in cases where the magazines are conveyed by a conveyor means.

SUMMARY OF THE INVENTION

Accordingly, the primary object of the present invention is to provide a magazine conveying device in which adjustment of magazine guide members can easily be accomplished.

It is another object of the present invention to provide a magazine conveying device which includes a magazine guide means that is widely used regardless of whether the magazine loader section is a stage or a conveyor means.

The objects of the present invention are accomplished by a unique structure for a lead frame magazine conveying device in which:

a magazine loader section for supplying magazines and a magazine unloader section for receiving magazines are provided in a vertical relation ship, an elevator which receives magazines from the magazine loader section and is raised (or lowered) so that the magazines are positioned at a lead frame receiving position (or lead frame feed-out position) and then is further raised (or lowered) so that the magazines which have received (or fed out) lead frames are transferred onto the magazine unloader section, a first guide means which guides one side of each magazine; and a second guide means which guides the other side of each magazine, and the unique structure of the present invention is that the second guide means which is used for magazine width adjustment comprises:

a supporting shaft which is rotatable above the magazine loader section and on the opposite side from the first guide means, a swinging lever which is fastened to the supporting shaft and extends downward, a guide member which is fastened to the lower end of the swinging lever and extends in the conveying direction of the magazines, and a fastening screw which fastens the supporting shaft in place.

When the fastening screw is loosened, the supporting shaft becomes rotatable. Accordingly, the guide member connected to the supporting shaft is pivoted about the supporting shaft, so that a magazine placed on the magazine loader section is guided on its one side by the first guide means and on its other side by the guide member (of the second guide means) which is pivoted so as to be brought, lightly, into contact with the other side of the magazine. Then, the supporting shaft is positionally fixed in place by tightening the fastening screw so that the guide member is not pivoted and is immovable.

Thus, the adjustment of the guide means is accomplished by merely loosening the fastening screw and moving the guide member onto the side of the magazine. Accordingly, the adjustment can be performed quickly and easily. Furthermore, since the magazine width adjustment guide means has a swinging structure which hangs downward from a point above the magazine loader section, such a guide means can be used regardless of whether the magazine loader section is a stage or a conveyor means.

DETAILED DESCRIPTION OF THE INVENTION

One embodiment of the lead frame conveying device of the present invention will be described with reference to FIGS. 1 through 6.

Figure 1:
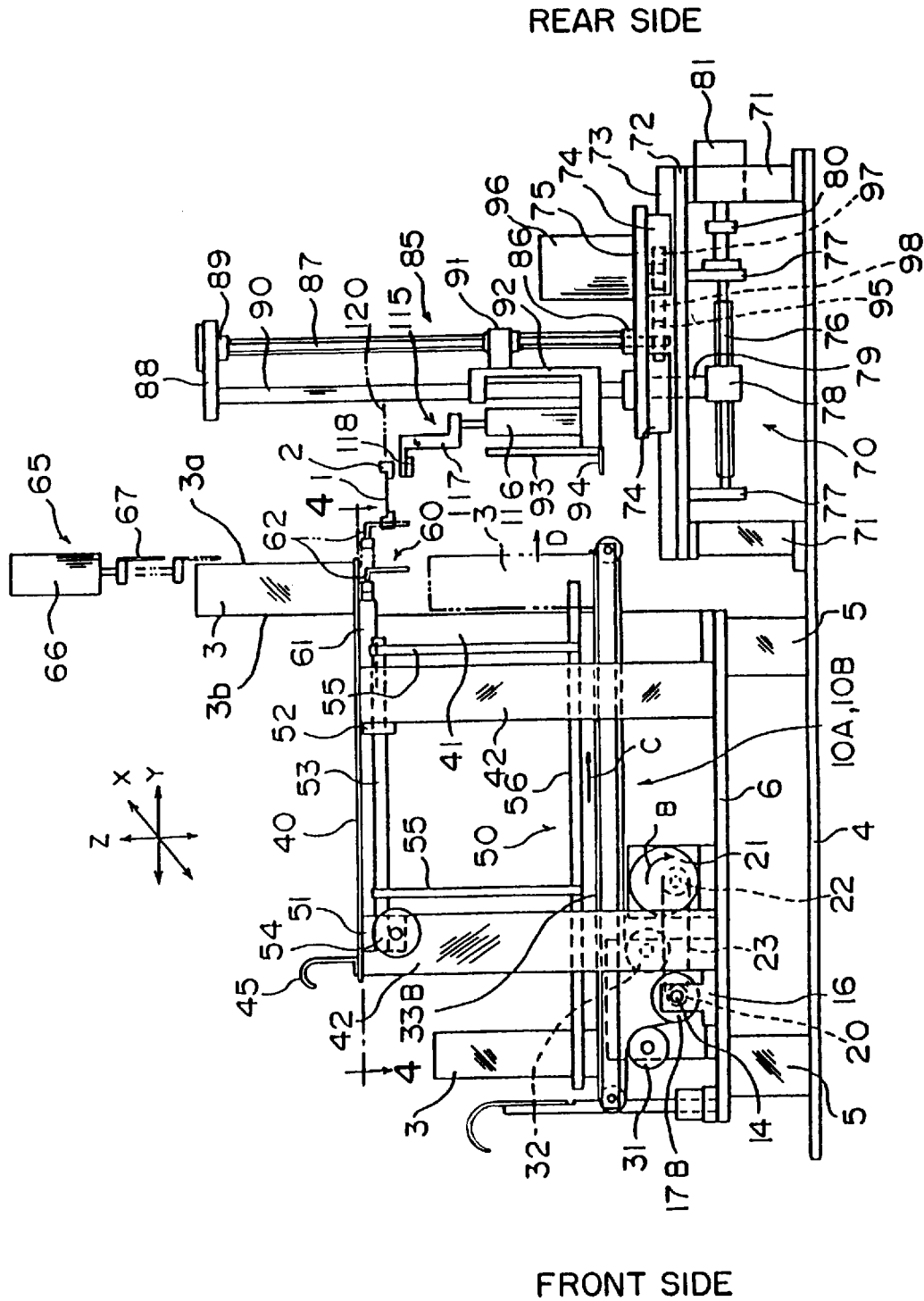
FIG. 1 is a side view of one embodiment of the magazine conveying device of the present invention.

The conveying device is installed on the foreword or rearward end of the frame guide 2 which guides lead frames 1 in the X-direction (described later). In addition, in this embodiment, the left side in FIG. 1 is referred to as a front side (i.e., the operating side which is operated by a worker) and the right side is as a rear side; and the device of the present invention is provided on the lead frame unloader side where a lead frame 1 is transferred into a lead frame magazine 3 from the frame guide 2. Furthermore, the direction in which the frame guide 2 extends, i.e., the conveying direction of the lead frames 1 (which is perpendicular to the surfaces of the drawing sheet) will be referred to as the X direction, the direction perpendicular to the X direction as seen from above of the device in FIG. 1 will be referred to as the Y direction, and the vertical direction will be referred to as the Z direction.

As shown in FIGS. 2 through 6, two magazine loader conveyor means 10A and 10B which have more or less the same structure and convey empty lead frame magazines ("magazines") 3 are installed so that the conveyor means extend in the Y direction beneath the frame guide 2 from the front side of the device.

The structures of the magazine loader conveyor means 10A and 10B will be described.

Figure 3:
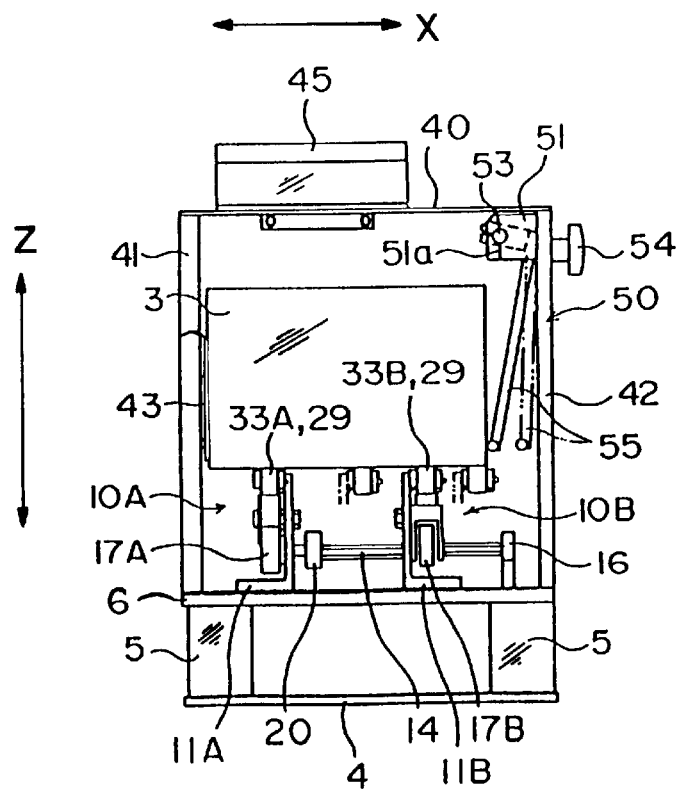
FIG. 3 is a left-side view of FIG. 2 showing the front side of the device.
Figure 6:
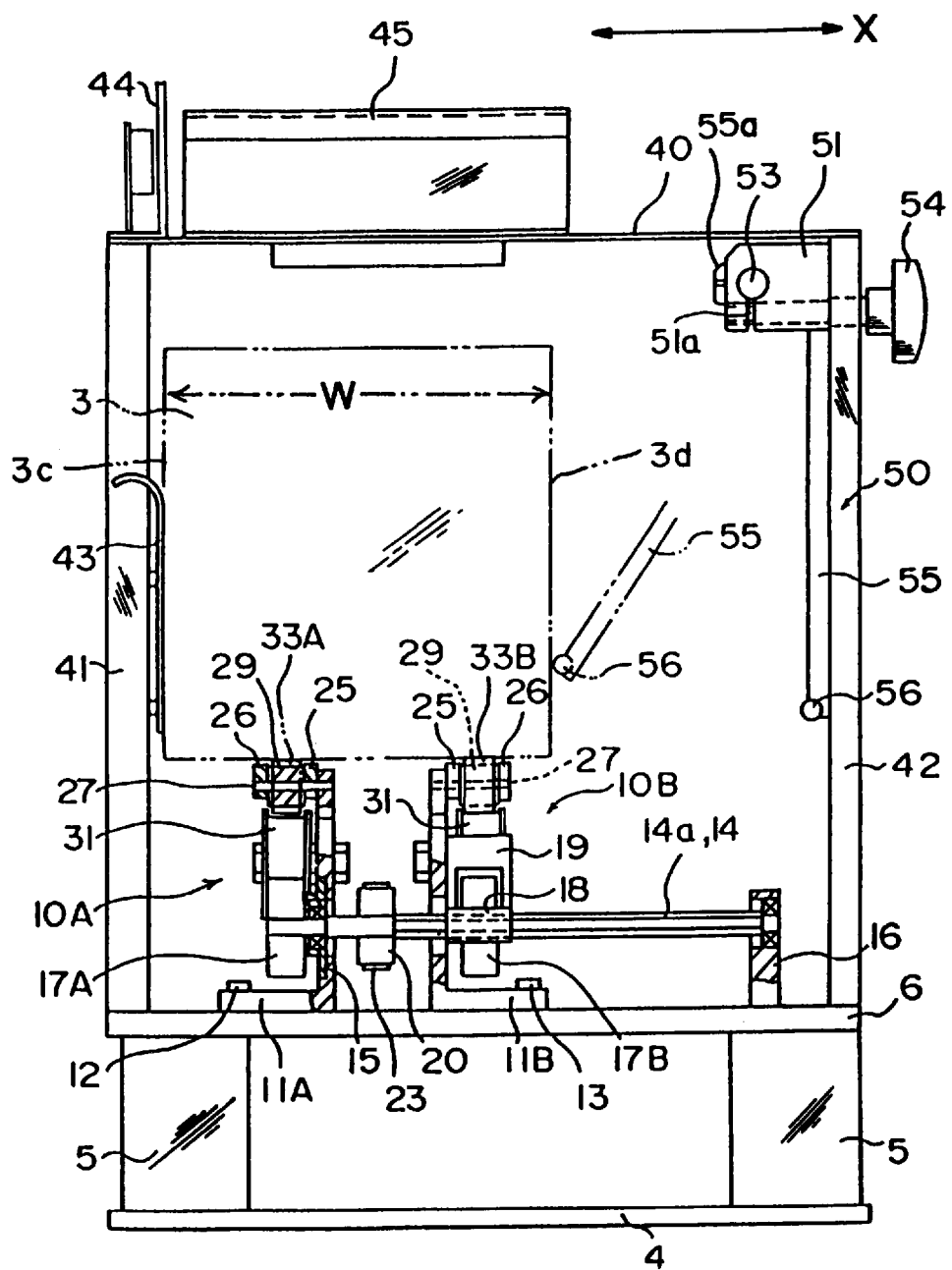
FIG. 6 is an enlarged sectional view of FIG. 3.

As shown in FIGS. 1, 3 and 6, a sub-base plate 6 is fastened to a base plate 4 via supporting columns 5, and, as best seen from FIG. 3, conveyor supporting plates 11A and 11B of the magazine loader conveyor means 10A and 10B are fastened to the sub-base plate 6 so that the supporting plates 11A and 11B are located on the front side of the device.

Figure 4:
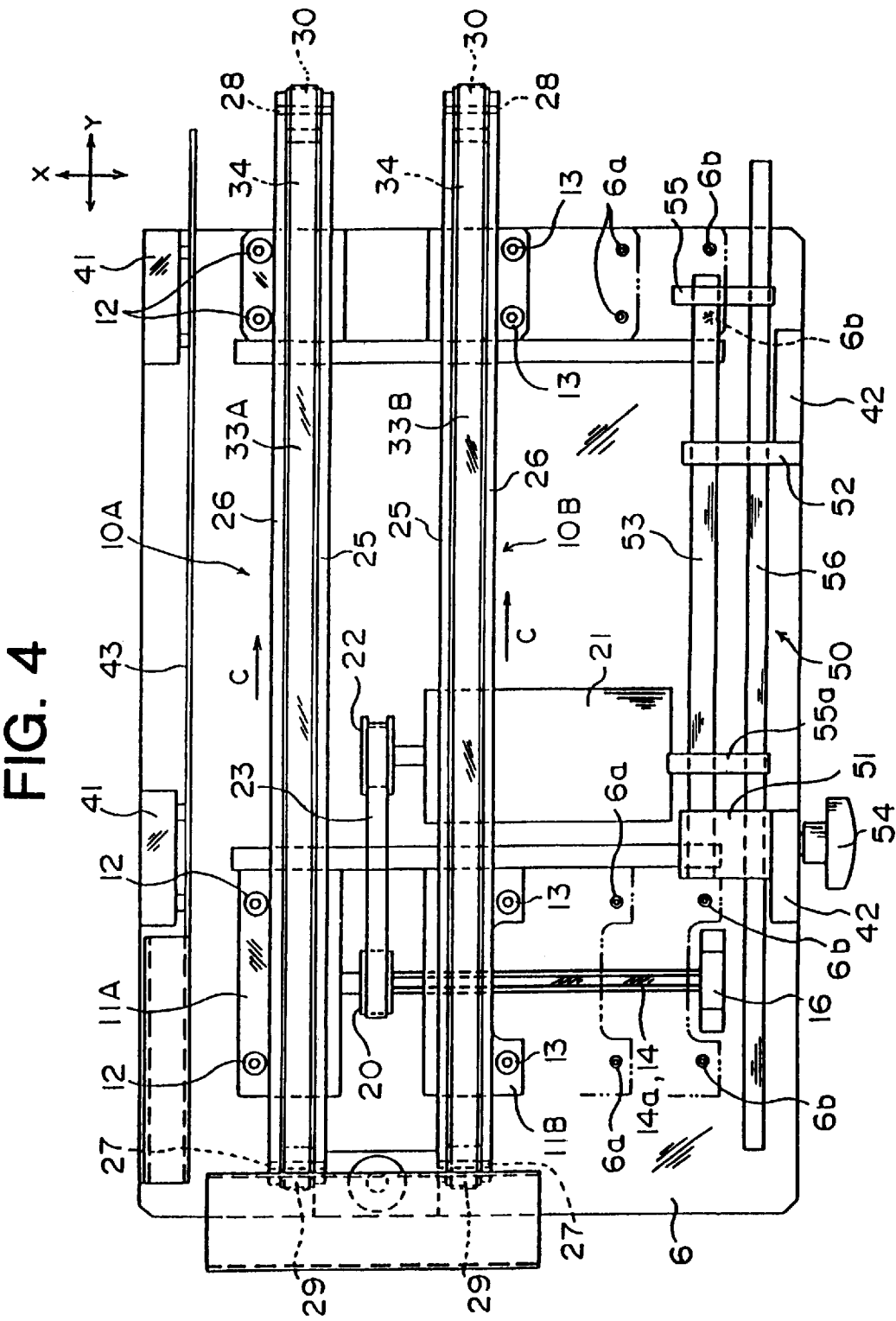
FIG. 4 is an enlarged top view of the area indicated by line 4—4 in FIG. 1.
Figure 5:
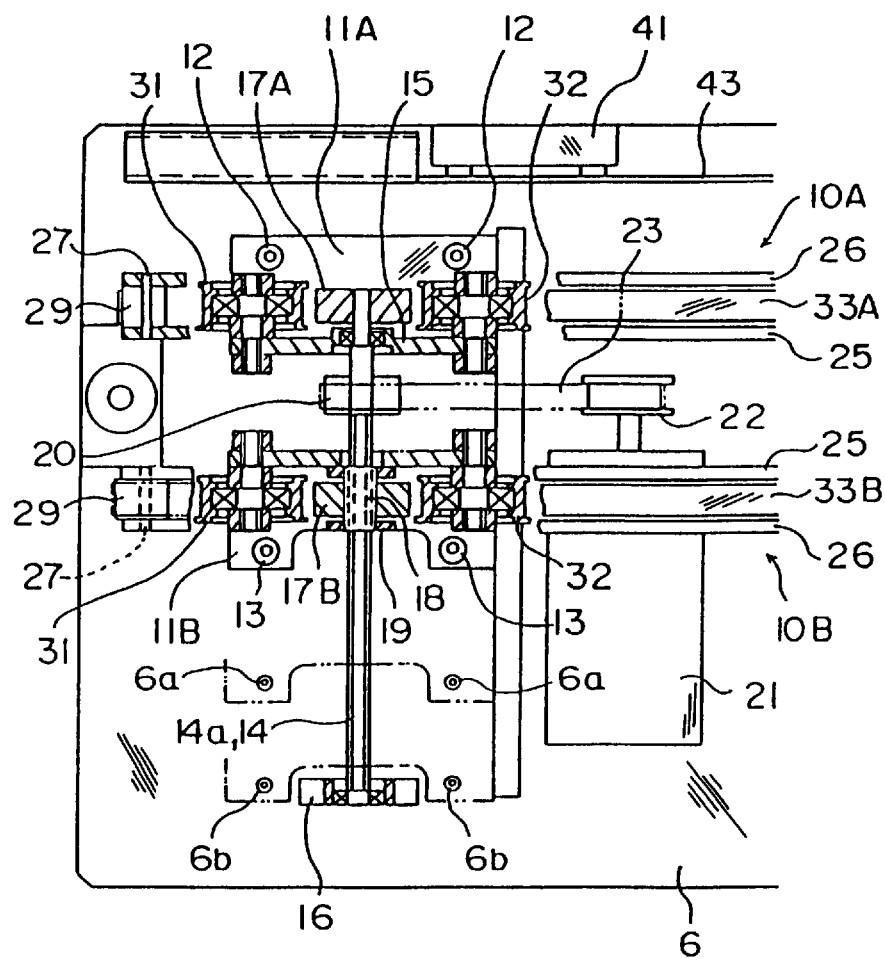
FIG. 5 is a partially sectional top view of the front side portion of the device shown in FIG. 4.

As shown in FIGS. 4 through 6, the conveyor supporting plate 11A is fastened to the sub-base plate 6 by bolts 12 so that the conveyor supporting plate 11A is immovable. The conveyor supporting plate 11B, on the other hand, is mounted on the sub-base plate 6 by bolts 13 so that the position of the conveyor supporting plate 11B can be changed in the X direction. More specifically, three (3) screw holes 6a and 6b with which the bolts 13 engage are formed in the sub-base plate 6 in the X direction so that the conveyor supporting plate 11B and therefore the magazine loader conveyor means 10B can be shifted to any of three positions.

A drive shaft 14 which has a spline shaft section 14a is installed in the X direction so that the drive shaft 14 passes through the conveyor supporting plates 11A and 11B. As best seen from FIG. 6, the ends of the drive shaft 14 are supported by a bearing holder 15 which is fastened to the conveyor supporting plate 11A and by a bearing holder 16 which is fastened to the sub-base plate 6, so that the drive shaft 14 is rotatable.

A drive pulley 17A is, as seen in FIG. 5, fastened to one end of the drive shaft 14 located on the conveyor supporting plate 11A side. A spline holder 18 is fitted over the spline shaft section 14a of the drive shaft 14 so that the spline holder 18 can slide on the drive shaft 14 in its axis direction and rotate together with the drive shaft 14, and a drive pulley 17B is fastened to the spline holder 18. A holder 19 which regulates the positions of both sides of the drive pulley 17B is fastened to the conveyor supporting plate 11B so that the spline holder 18 and drive pulley 17B can move along the axis of the spline shaft section 14a together with the conveyor supporting plate 11B.

A pulley 20 is fastened to the drive shaft 14. A conveyor motor 21 is fastened to the sub-base plate 6, and a drive belt 23 is installed between the pulley 20 and a pulley 22 which is fastened to the output shaft of the conveyor motor 21.

Belt guide plates 25 which extend in the Y direction from the front side of the device to beneath the frame guide 2 are respectively fastened to the upper end portions of the conveyor supporting plates 11A and 11B, and belt guide plates 26 are installed so as to face the belt guide plates 25. As best seen from FIG. 4, both end portions of these belt guide plates 25 and 26 are provided with a roller shaft 27 and 28, respectively, and rollers 29 and 30 are rotatably provided on each of the roller shafts 27 and 28. The rollers 29 and 30 are positioned so as to be above the drive pulleys 17A and 17B, respectively.

Guide pulleys 31 and 32 are rotatably provided on the conveyor supporting plates 11A and 11B so that they are located on both sides of the supporting plates 11A and 11B in the Y direction. These pulleys 31 and 32 are positioned directly above the drive pulleys 17A and 17B. Conveyor belts 33A and 33B are installed as endless loops on the rollers 29 and 30, guide pulleys 31 and 32, and drive pulleys 17A and 17B.

Belt supporting plates 34 are fastened to (or between) the belt guide plates 25 and 26 in order to prevent the upper portions of the conveyor belts 33A and 33B between the rollers 29 and 30 from drooping downward.

Figure 2:
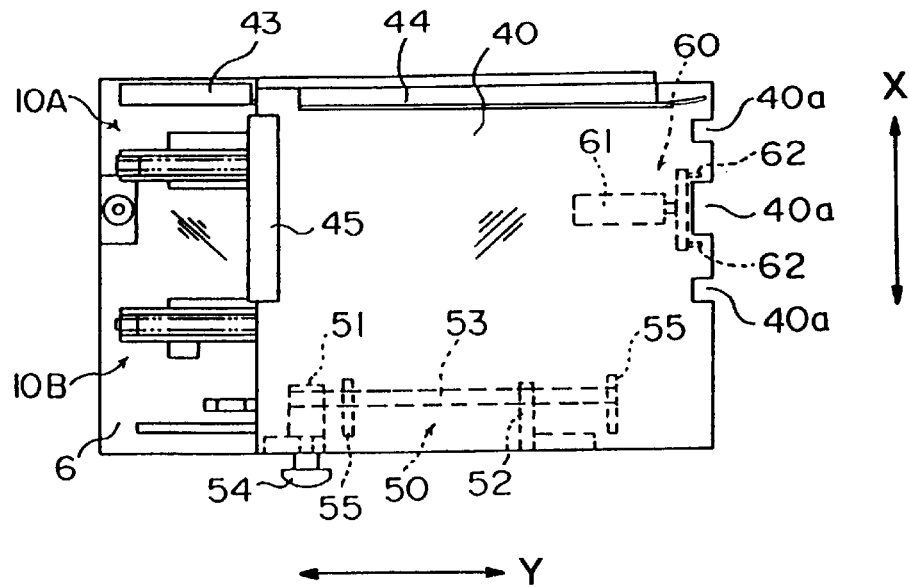
FIG. 2 is a top view of FIG. 1 with the elevator system thereof excluded.

As shown in FIGS. 1 through 3, a magazine unloader stage 40 is installed above the magazine loader conveyor means 10A and 10B and also above the frame guide 2. In addition, the stage 40 is positioned so as to be higher than the height of a magazine which is on the upper surfaces of the conveyor belts 33A and 33B. The magazine unloader stage 40 is mounted on the sub-base plate 6 via supporting plates 41 and 42. In other words, the magazine loader conveyor means 10A and 10B and the magazine unloader stage 40 form a two-stage structure comprising upper and lower stages, the conveyor means 10A and 10B being on a lower stage and the magazine unloader stage 40 being on an upper stage.

As shown in FIGS. 4 and 6, a lower fixed guide 43 which guides the magazines 3 conveyed by the magazine loader conveyor means 10A and 10B is fastened to the supporting plates 41 so as to face the magazine loader conveyor means 10A. In addition, as shown in FIGS. 2 and 6, an upper fixed guide 44 is fastened to the magazine unloader stage 40 so as to be above the lower fixed guide 43. The reference numeral 45 is a stopper plate which is fastened to the front side of the magazine unloader stage 40, and 40a is a cutout formed on the stage 40 so as to be on the opposite side from the stopper plate 45.

As shown in FIGS. 1 through 4 and FIG. 6, a magazine width adjustment guide means 50 is installed on the supporting plates 42 so as to be on the opposite side from the lower fixed guide 43 and to face the bearing holder 16. The detailed structure of this magazine width adjustment guide means 50 will be described below.

Primary shaft holder 51 and a supportive shaft holder 52 are provided on the upper end portions of the inner surfaces of two supporting plates 42, and a horizontal direction hole (not shown) is provided in each of the shaft holders 51 and 52, and a supporting shaft 53 which extends in the Y direction is inserted in these holes of the shaft holders 51 and 52. The supporting shaft 53 is rotatable inside these holes of shaft holders 51 and 52. A groove 51a is formed in the primary shaft holder 51 so as to extend in the vertical direction in FIG. 6 and communicated with the hole (not shown) of the primary shaft holder 51 into which the supporting shaft 50 is inserted. A fastening screw 54 is screwed into the primary shaft holder 51 so that the fastening screw 54 tightens and loosens the supporting shaft 53 by narrowing and widening the groove 51a. A swinging lever 55 is fastened to the supporting shaft 53 at its top section 55a so as to extend downward. A guide rod 56 which extends in the Y direction is fastened to the lower portion of the swinging lever 55.

In addition, as seen from FIGS. 1, 2 and 4, a magazine attitude adjusting means 60 is installed on the undersurface of the magazine unloader stage 40 so as to be located on the frame guide 2 side.

The magazine attitude adjusting means 60 includes an air cylinder 61, which is fastened to the undersurface of the magazine unloader stage 40, and a pair of pushers 62, which are fastened to the operating rod of the air cylinder 61.

Furthermore, as shown in FIG. 1, a shutter 65 which prevents the magazine from falling over is installed above the magazine unloader stage 40 and on the frame guide 2. The shutter 65 includes an electromagnetic solenoid 66, which is mounted to a fixed portion of the device, and a shutter plate 67, which extends downward and is fastened to a movable part of the electromagnetic solenoid 66 so as to be moved up and down.

The reference numeral 85 in FIG. 1 is an elevator 85, and the reference numeral 70 is a horizontal driving means. These are provided on the rear side of the magazine loader conveyor means 10A and 10B and magazine unloader stage 40. The horizontal driving means 70 is for moving the elevator 85 in the horizontal direction so that the elevator 85 advances toward and withdraws from the magazine loader conveyor means 10A and 10B and magazine unloader stage 40. Though the horizontal driving means 70 and elevator 85 have more or less the same structure as in a conventional device, the structures of these two (2) elements are described below.

The structure of the horizontal driving means 70 will be described first.

An elevator stage 72 is fastened to the base plate 4 via supporting plates 71, and guide rails 73 which extend in the Y direction are mounted on the upper surface of the elevator stage 72. Guides 74 are engaged with the guide rails 73 so that the guides 74 can slide on the guide rails 73, and a horizontal moving plate 75 is provided on the guides 74. An outer threaded screw 76 is installed in the Y direction so as to be beneath the elevator stage 72; and both ends of the outer threaded screw 76 are supported in bearing holders 77, which are fastened to the undersurface of the elevator stage 72, so that the outer threaded screw 76 is rotatable. An inner threaded screw block 78 is screw-engaged with the outer threaded screw 76 and is fastened to the horizontally moving plate 75 via a supporting block 79. Accordingly, a slot (not shown) which extends in the Y direction is formed in the elevator stage 72 so that the supporting block 79 passes through it. The horizontal movement motor 81 is fastened to the elevator stage 72, and the output shaft of this horizontal movement motor 81 is fastened to one end portion of the male screw 76 via a coupling 80.

The structure of the elevator 85 is as follows:

An outer threaded screw 87 is provided vertically or in the Z direction so that the lower end portion of the screw 87 is rotatably supported on the upper surface of the horizontally moving plate 75 via a bearing holder 86 and the upper end portion of the outer threaded screw 87 is rotatably supported via a bearing holder 89 which is fastened to a supporting plate 88. Furthermore, the upper and lower ends of a guide rod 90 which is provided vertically or in the Z direction are fastened to the horizontally moving plate 75 and the supporting plate 88. An inner threaded screw block 91 is engaged with the outer threaded screw 87, and a vertically movable member 92 which is fitted over the guide rod 90 so that the raising-and-lowering member 92 can slide up and down is fastened to the inner threaded screw block 91. A positioning plate 93 which is to be contacted by the side surface of the magazine 3 is provided on the vertically movable member 92, and magazine holders 94 on which the magazine 3 is carried are provided at the lower end of the positioning plate 93. A timing pulley 95 is fastened to the lower end of the outer threaded screw 87, and a vertical movement motor 96 is fastened to the horizontally moving plate 75. A timing pulley 97 is fastened to the output shaft of the vertical movement motor 96. In addition, a timing belt 98 is installed between the timing pulley 95 of the outer threaded screw 87 and the timing pulley 97 of the vertical movement motor 96.

A chuck means 115 which chuck-holds magazines 3 is installed on the elevator 85. The chuck means 115 has more or less the same structure as a conventional device and includes an air cylinder 116 which is provided on the vertically movable member 92 so as to be upright. A holding member 117 is fastened to the operating rod of the air cylinder 116, and a holding plate 118 is fastened to the supporting plate 117 so as to face the magazine holders 94.

The operation of the lead frame conveying device of the above embodiment will be described below.

In cases where a magazine that has a different width from that of the magazines which have been conveyed is to be conveyed due to a change in the type of product (lead frame) to be handled, the magazine loader conveyor means 10B and the magazine width adjustment guide means 50 are operated so as to meet the width of the changed or new magazine.

First, the adjustment of the magazine loader conveyor means 10B will be described. FIGS. 4 through 6 illustrate a case in which the magazine loader conveyor means 10B has been adjusted to meet magazines that have the smallest width or X-direction length W. Therefore, the description below will be about the adjustment to meet a magazine that has a larger width in the X-direction than the smallest X-direction length magazine so that the conveying of the larger magazines can be executed in a stable fashion.

The bolts 13 are first loosened and removed, and the conveyor supporting plate 11B is moved along the drive shaft 14.

When the conveyor supporting plate 11B is thus moved along the drive shaft 14, the spline holder 18 is also moved since the spline holder 18 is held by the holder 19 and can move in the axial direction of the spline shaft section 14a of the drive shaft 14.

The conveyor supporting plate 11B is, as a result, positioned so that they are fastened at the locations of the screw holes 6a or 6b. FIGS. 2 and 3 show a state in which the conveyor supporting plate 11B is positioned at the screw holes 6a.

After the conveyor supporting plate 11B has thus been moved to a position which meets the width of a new magazine, the conveyor supporting plates 11B is fastened to the subbase plate 6 by the bolts 13.

The adjustment of the magazine loader conveyor means 10B is thus completed.

Next, the adjustment of the magazine width adjustment guide means 50 will be described. This adjustment is performed after the new magazine is placed on the conveyor belts 33A and 33B of the magazine loader conveyor means 10A and 10B so that the front and rear surface 3a and 3b (see FIG. 1) of the magazine 3 are oriented in the X direction and after one side 3c of the magazine 3 is brought into contact with fixed guide 43 (see FIG. 6).

The fastening screw 54 is first loosened so that it becomes possible for the supporting shaft 53 to rotate relative to the shaft holders 51 and 52. When the fastening screw 54 is thus loosened, the guide rod 56 is now swingable about the supporting shaft 53.

Then, the guide rod 56 is manually brought so as to lightly contact the other side 3b of the magazine 3, and the fastening screw 54 is tightened back. As a result, the supporting shaft 53 is secured to the shaft holder 51 and therefore is no longer rotatable. In other words, the spacing between the fixed guide 43 and the guide rod 56 can be matched to the width (or X-direction length) of the new magazine 3.

Next, the conveying of the magazine(s) 3 will be described.

Before starting, the elevator 85 is at a lowered position as shown in FIG. 1 and is positioned on the side of the magazine loader conveyor means 10A and 10B. Furthermore, the tip ends (left side end in FIG. 1) of the magazine holders 94 are positioned close to the right side ends of the magazine loader conveyor means 10A and 10B. In addition, the upper surfaces of the magazine holders 94 are positioned slightly below the upper surfaces of the conveyor belts 33A and 33B. In this state, the empty or new magazine 3 is placed on the front side (left end side in FIG. 1) of the magazine loader conveyor means 10A and 10B.

Then, the "start" button (not shown) is pressed, so that the conveyor motor 21 is actuated. As a result, the pulley 22 connected to the output shaft of the motor 21 is rotated in the direction indicated by arrow B, and the drive shaft 14 is, as a result, rotated in the same direction i.e., the direction indicated by arrow B via the drive belt 23 and pulley 20.

Since the drive shaft 21 is rotated, the drive pulleys 17A and 17B mounted thereon is rotated in the direction of arrow B, and the conveyor belts 33A and 33B are moved in the direction of arrow C, thus causing the magazine 3 placed on the conveyor belts 33A and 33B to be conveyed in the direction of arrow C while being guided by the fixed guide 34 and guide rod 56 of the magazine width adjustment guide means 50 until the magazine 3 comes into contact with the portioning plate 93 of the elevator 85.

Next, the air cylinder 116 of the chuck means 115 is actuated, so that the holding plate 118 descends and so as to hold the magazine 3 between the holding plate 118 and the magazine holders 94. However, since the upper surfaces of the magazine holders 94 are positioned slightly below the upper surfaces of the conveyor belts 33A and 33B, the magazine 3 is not securely held under these conditions.

As a result, the vertical movement motor 96 is actuated so that the elevator 85 is moved upward. More specifically, the rotation of the vertical movement motor 96 is transmitted to the outer threaded screw 87 via the timing pulley 97, timing belt 98 and timing pulley 95, so that the inner threaded screw block 91, the vertically movable member 92 and the magazine holders 94 are all moved upward. When the magazine holders 94 are thus moved slightly upward, the holding plate 118 presses the magazine 3 against the magazine holders 94, thus securely chuck-holding the magazine 3 in between.

When the elevator 85 is thus moved slightly upward, the horizontal driving means 70 is actuated. More specifically, the horizontal movement motor 81 is actuated, and the rotation of this motor 81 is transmitted to the outer threaded screw 76. Since the inner threaded screw block 78 is fastened to the horizontally moving plate 75 via the supporting block 79, the horizontally moving plate 75 moves in the direction of arrow D, so that the positioning plate 93 of the elevator 85 is moved away from the magazine loader conveyor means 10A and 10B.

When the elevator 85 is moved upward and the horizontally moving plate 75 is moved in the direction of arrow D as described above, the uppermost lead frame accommodating section of the magazine 3 held by the elevator 85 is brought to the level of the lead frame receiving position 120.

In the movements described above, when a magazine 3 is received (from the magazine loader conveyor means 10A and 10B) by the elevator 85 and held by the chuck means 115, there may be a chance in which the magazine 3 is not fitted tightly against the positioning plate 93 of the elevator 85 but is instead held in a floating or inclined state. When holding of the magazine is thus not performed in the correct fashion, the lead frame 1 sent from the frame guide 2 will not be accurately accommodated in the magazine 3.

In the embodiment described above, after the elevator 85 that holds the magazine 3 has been moved up, the air cylinder 116 of the chuck means 115 is actuated so that the holding plate 118 is moved upward, thus temporarily releasing the magazine 3. Then, the air cylinder 61 of the magazine attitude adjusting means 60 is actuated so that the magazine 3 is pressed against the positioning plate 93 by the pusher 62 attached to the air cylinder 61, thus correcting the attitude of the magazine 3.

When the magazine 3 is thus pressed against the positioning plate 93 by the pusher 62, the air cylinder 116 is actuated in the reverse direction so that the magazine 3 is pressed against the magazine holders 94 by the holding plate 118 and is thus held. Afterward, the air cylinder 61 is actuated in the opposite direction from that described above so that the pusher 62 is released from the magazine 3. As a result, the magazine 3 is held in the corrected attitude and position. After this, the elevator 85 is again moved upward until the uppermost lead frame accommodating section of the magazine 3 reaches the lead frame receiving position 120.

When the (corrected) magazine is thus moved upward, a pusher (not shown) is actuated so that a lead frame 1 sent from the frame guide 2 is pushed into the uppermost lead frame accommodating section of the magazine 3. Once the lead frame 1 has been accommodated in the uppermost stage of the magazine 3, the vertical movement motor 96 is actuated, thus causing the elevator 85 to be moved up further so that the next uppermost lead frame accommodating section of the magazine 3 faces the lead frame receiving position 120. Then, the next lead frame sent from the frame guide 2 is pushed into the next uppermost lead frame accommodating section of the magazine 3. Afterward, this operation is simply repeated.

When all of the lead frames 1 have been pushed into the magazine 3, the vertical movement motor 96 is again actuated so that the elevator 85 is further moved up. Afterward, the horizontal movement motor 81 is actuated in the opposite direction from that described above so that the magazine holders 94 of the elevator 85 are brought into the cut-outs 40a of the magazine unloader stage 40 and then set to be positioned slightly above the magazine unloader stage 40.

The air cylinder 116 of the chuck means 115 is next actuated so that the holding plate 118 is moved upward and releases the magazine 3.

Then, the vertical movement motor 96 is actuated so that the elevator 85 is lowered. As a result, the magazine 3 carried on the magazine holders 94 is moved to and placed on the magazine unloader stage 40.

After this, the elevator 85 is lowered and is moved to its original position so that it can receive the next, new magazine from the magazine conveyor means 10A and 10B.

When the magazine 3 is transferred onto the magazine unloader stage 40 from the elevator 85, the magazine 3 is positioned at the (right side) end portion of the magazine unloader stage 40 as seen from FIG. 1. Accordingly, if the magazine 3 is not completely on the magazine unloader stage 40, or if the magazine 3 is positionally shifted due to vibration, etc., so that a part of the magazine 3 moves over the edge of the magazine unloader stage, thus causing the magazine 3 to be unstable, there is a danger that the magazine may fall to one side of the elevator 85 and drop from the magazine unloader stage 40.

In the present embodiment, when the magazine holders 94 are positioned slightly above the magazine unloader stage 40, the electromagnetic solenoid 66 of the shutter 65 which is used to prevent the magazine from falling over is actuated so that a shutter plate 67 is moved down so as to come close to or to come into contact with the front side 3*a* of the magazine 3. As a result, even if the holding of the magazine 3 is released and the elevator 85 is lowered, there is no danger that the magazine 3 will fall from the magazine unloader stage 40. The shutter plate 67 of the shutter 65 is next withdrawn by the electromagnetic solenoid 66 in the opposite direction from that described above immediately prior to the unloading of the next magazine onto the magazine unloader stage 40.

Subsequently, the operation is simply repeated.

The magazine 3 which has been transferred onto the magazine unloader stage 40 is pushed toward the stopper plate 45 by the next magazine which is full of lead frames and is transferred onto the stage 40 from the elevator 85.

In the above embodiment, an empty magazine 3 is set on the magazine loader conveyor means 10A and 10B, and lead frames 1 fed on the frame guide 2 are pushed into the empty magazine 3. However, it is also possible to use the device of the present invention when releasing the lead frames from the magazine 3. In this case, a magazine 3 in which lead frames 1 are accommodated is set on the magazine loader conveyor means 10A and 10B, and the lead frame receiving position 120 is used as a lead frame feed-out position. The magazines 3 are transferred onto the elevator 85 and then raised by the elevator 85, so that the lead frames are fed out onto the frame guide 2 from the magazine 3, after which the empty magazine 3 is placed on the magazine unloader stage 40.

In addition, in the embodiment described above, the magazine loader conveyor means 10A and 10B are provided below the magazine unloader stage 40. Conversely, however, it is possible to install the magazine loader conveyor means 10A and 10B above the magazine unloader stage 40. In this case, lead frames are received by and fed out of the magazine when the elevator 85 is lowered.

Furthermore, in the above embodiment, the magazine loader section comprises the magazine loader conveyor means 10A and 10B. However, it is also possible to construct the magazine loader section from a magazine loader stage and a pusher means which pushes the rear end of magazines set on the loader stage.

The shutter plate 67 is installed so as to be moved vertically in the above described embodiment; however, the shutter 65 can be provided so that the shutter plate 67 is moved back and forth horizontally to come into contact with the magazine 3 transferred onto the magazine unloader stage 40.

The embodiment above is described with regard to lead frames; however the present invention is applicable to thin plates such as printed wafer substitutes, etc.

As seen from the above, when the width of the magazines 3 is changed due to a change in the type of product to be handled, adjustment to meet such a change is performed with one side of the magazine 3 being in contact with the fixed guide 43. In other words, with the one side of the magazine being in contact with the fixed guide 43, the fastening screw 54 is loosened, the guide rod 56 is brought into contact with the other side of the magazine 3, and the supporting shaft 53 is positionally fixed in place by tightening the fastening screw 54. Thus, the adjustment can be accomplished by merely loosening the fastening screw 54 and causing the guide rod 56 to pivot; therefore, a quick and easy adjustment is secured.

Furthermore, since the device has a swinging structure which hangs downward from a point above the magazine loader section, the device can be used regardless of whether the magazine loader section is a stage or a conveyor means.

As seen from the above, according to the present invention, the magazine conveying device includes a magazine width adjustment guide means which is comprised of: a supporting shaft which is rotatable above the magazine loader section so as to be located on the opposite side from the fixed guide, a swinging lever which is fastened to the supporting shaft and extends downward, a guide member which is fastened to the lower end of the swinging lever and extends in the conveying direction of the magazines, and a fastening screw which, when tightened, fastens the supporting shaft in place so as not to rotate. Accordingly, adjustment of the guide member can be easily done, and the device of the present invention can be widely applicable regardless of whether the magazine loader section is a stage or a conveyor means.

We claim:

1. A magazine conveying device comprising:

a magazine loader section for supplying magazines and a magazine unloader section for receiving magazines which are provided in a vertical relationship, said magazine loader section being provided with a magazine conveying means, an elevator means which is provided vertically so as to move said magazines from said magazine loader section onto said magazine unloader section, a first guide means which is immovable provided in said magazine loader section so as to guide one end of each of said magazines, and a second guide means which is provided in said magazine loader section in a swingable fashion so as to come into contact with one side of said magazines, said second guide means comprising:

a supporting shaft rotatably provided above said magazine loader section at a location opposite from said first guide means, a swinging lever fastened at one end thereof to said supporting shaft and extending downwardly, a guide member provided at another end of said swinging lever and extending parallel to a direction said magazine conveying means conveys said magazines, and a fastening means for preventing said supporting shaft form rotating when said fastening means is tightened by a screw means.

* * * * *